United States Patent
Lin

(10) Patent No.: US 10,312,128 B2
(45) Date of Patent: Jun. 4, 2019

(54) CHEMICAL-MECHANICAL POLISH (CMP) DEVICES, TOOLS, AND METHODS

(71) Applicant: Taiwan Semiconductor Manufacturing Company, Ltd., Hsin-Chu (TW)

(72) Inventor: Chang-Sheng Lin, Baoshan Township (TW)

(73) Assignee: Taiwan Semiconductor Manufacturing Company Ltd., Hsin-Chu (TW)

( * ) Notice: Subject to any disclaimer, the term of this patent is extended or adjusted under 35 U.S.C. 154(b) by 321 days.

(21) Appl. No.: 14/986,113

(22) Filed: Dec. 31, 2015

(65) Prior Publication Data

US 2017/0194159 A1    Jul. 6, 2017

(51) Int. Cl.
| | | |
|---|---|---|
| *B24B 37/04* | (2012.01) | |
| *B24B 37/10* | (2012.01) | |
| *B24B 57/02* | (2006.01) | |
| *H01L 21/67* | (2006.01) | |
| *B24B 53/017* | (2012.01) | |
| *H01L 21/687* | (2006.01) | |

(52) U.S. Cl.
CPC ...... *H01L 21/68714* (2013.01); *B24B 37/042* (2013.01); *B24B 37/105* (2013.01); *B24B 53/017* (2013.01); *B24B 57/02* (2013.01); *H01L 21/67075* (2013.01); *H01L 21/67092* (2013.01)

(58) Field of Classification Search
CPC ......... H01L 21/30625; H01L 21/68714; H01L 21/67092; H01L 21/02052; H01L 21/67075

See application file for complete search history.

(56) References Cited

U.S. PATENT DOCUMENTS

| | | | | |
|---|---|---|---|---|
| 6,276,997 B1* | 8/2001 | Li | ..................... | H01L 21/67046 134/1.3 |
| 6,294,472 B1* | 9/2001 | Smith | ................... | B24B 37/044 156/345.12 |
| 6,398,906 B1* | 6/2002 | Kobayashi | ............ | B24B 41/061 156/345.12 |
| 8,021,566 B2* | 9/2011 | Chuang | ................. | B24B 37/042 216/59 |
| 2002/0142617 A1* | 10/2002 | Stanton | ................... | B08B 13/00 438/749 |

(Continued)

OTHER PUBLICATIONS

"Chemical-Mechanical Planarization," Wikipedia, https://en.wikipedia.org/wiki/Chemical-mechanical_planarization, last modified Jan. 1, 2015, downloaded Jul. 6, 2015, pp. 1-3.

*Primary Examiner* — Gordon Baldwin
*Assistant Examiner* — Mirza Israr Javed
(74) *Attorney, Agent, or Firm* — Slater Matsil, LLP

(57) ABSTRACT

Chemical-mechanical polishing (CMP) devices, tools, and methods are disclosed. In some embodiments, a device for a CMP tool includes a carrier and an embedded dummy disk coupled to the carrier. The embedded dummy disk comprises a substrate and a film disposed over the substrate. The carrier is coupleable to an arm of a handler of the CMP tool. The carrier and the embedded dummy disk are adapted to be embedded within a housing of the CMP tool. The embedded dummy disk is adapted to be polished by the CMP tool in preparation for a polishing process for a wafer.

20 Claims, 12 Drawing Sheets

(56) References Cited

U.S. PATENT DOCUMENTS

2003/0027424 A1* 2/2003 Paik ................. B24B 37/013
                                              438/692
2003/0219982 A1* 11/2003 Kurata ............... B24B 37/044
                                              438/692
2004/0261944 A1* 12/2004 Wakabayashi ....... B24B 37/345
                                              156/345.12

* cited by examiner

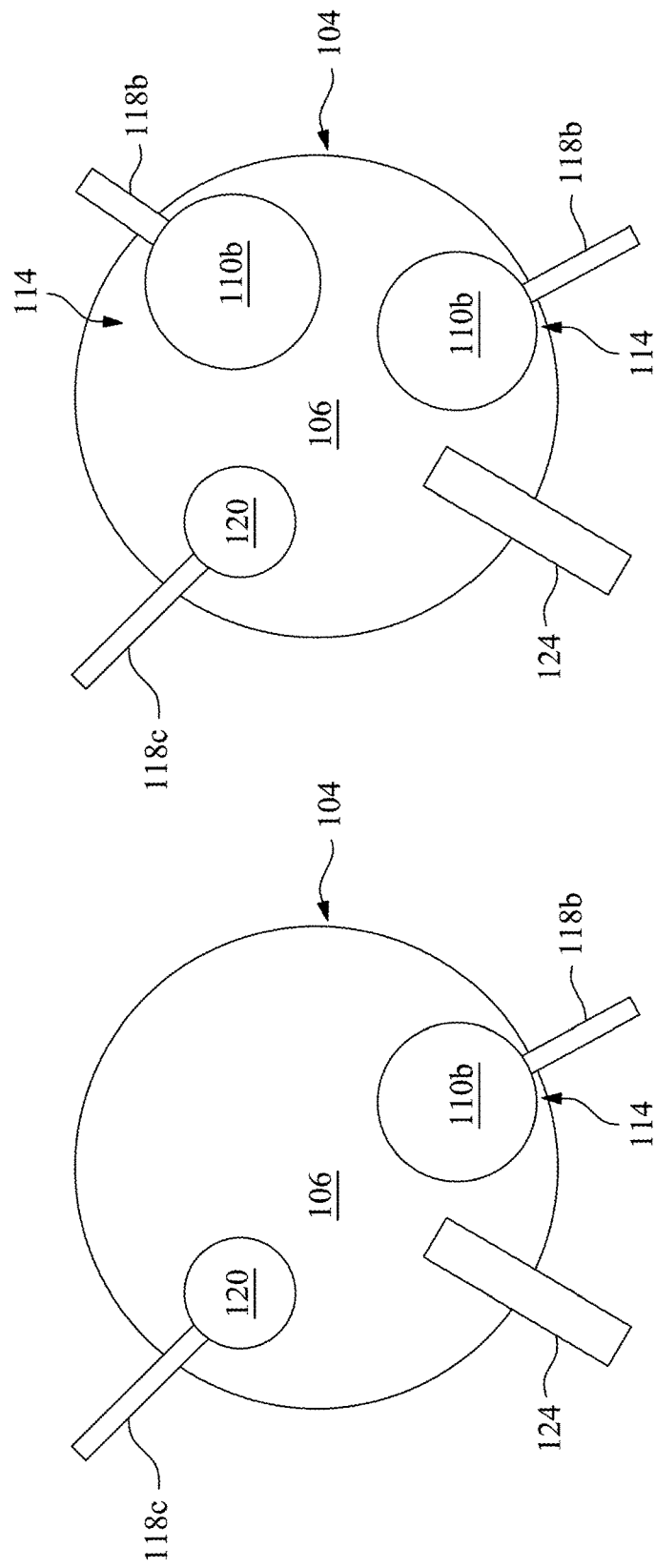

CHEMICAL-MECHANICAL POLISH (CMP) DEVICES, TOOLS, AND METHODS

BACKGROUND

Semiconductor devices are used in a variety of electronic applications, such as personal computers, cell phones, digital cameras, and other electronic equipment. Some semiconductor devices comprise integrated circuit dies, for example. Dozens or hundreds of integrated circuit dies are typically manufactured on a single semiconductor wafer and are later singulated by sawing the integrated circuits along scribe lines. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Chemical-mechanical polishing (CMP) is one type of process used in the manufacture of semiconductor devices. CMP is a process used to smooth and planarize surfaces of wafers using a combination of chemical and mechanical forces. Integrated circuit dies in wafer form are placed into a chamber of a CMP tool and are planarized or polished at various stages of a manufacturing process. CMP processes may be used to form planar surfaces on dielectric layers, semiconductive layers, and conductive material layers of a wafer, as examples.

CMP tools typically have a rotatable platen with a polishing pad attached to the platen. In some CMP processes, a semiconductor wafer is placed upside down against the polishing pad using a predetermined amount of pressure. A liquid dispersion referred to as a slurry that contains chemicals and microabrasive grains is applied to the polishing pad during the CMP process while the wafer is held against the rotating polishing pad. The wafer is also rotated in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5 through 9 show top views of portions of CMP tools that include various numbers of embedded dummy disks and carriers for the embedded dummy disks in accordance with some embodiments.

DETAILED DESCRIPTION

Figure 1:
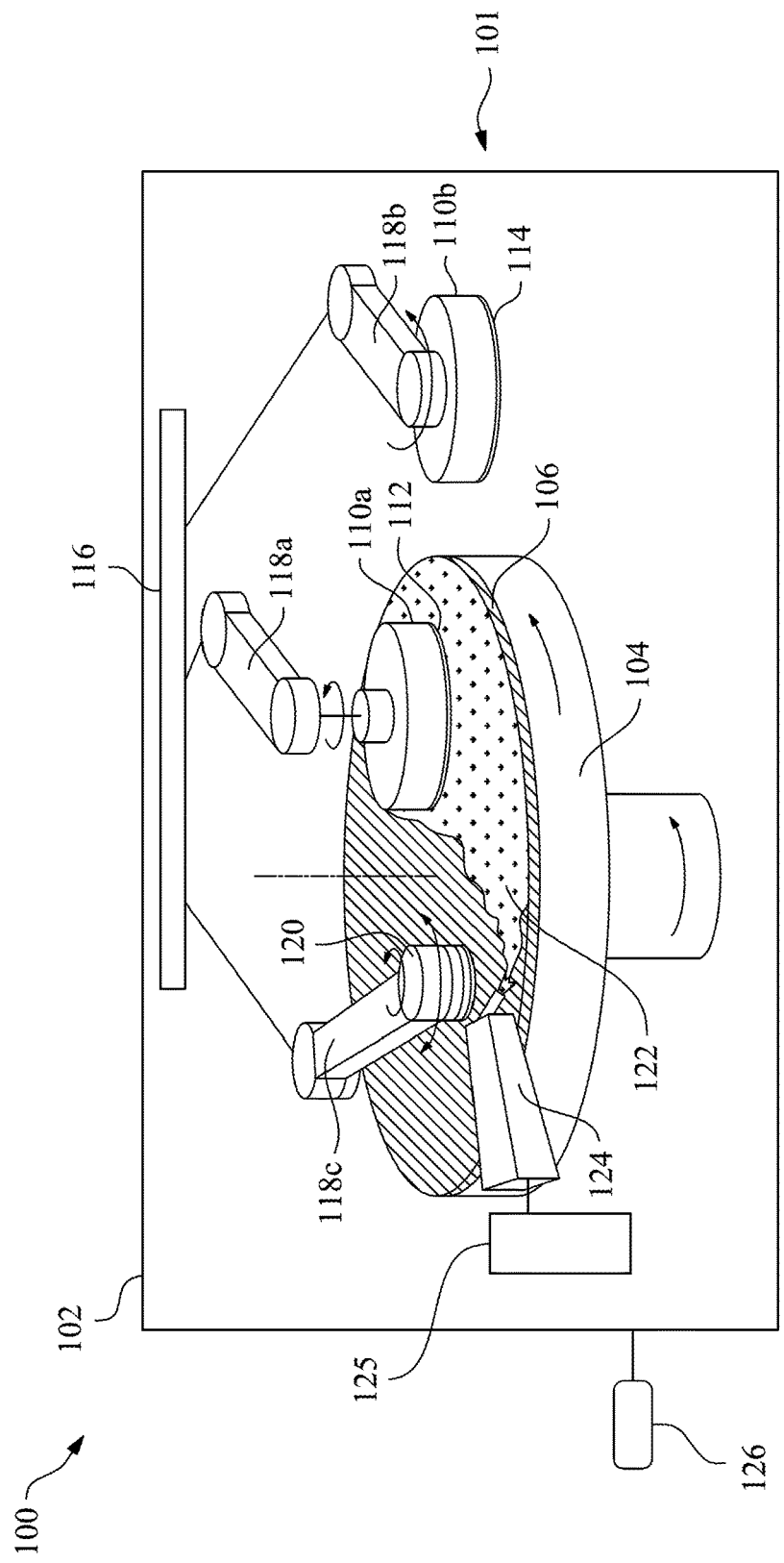
FIG. 1 is a diagram illustrating a CMP tool in accordance with some embodiments of the present disclosure that includes an embedded dummy disk.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMP devices, CMP tools, and methods of chemically-mechanically polishing wafers such as semiconductor wafers are disclosed in the present disclosure. Embedded dummy disks that are embedded in a CMP tool are used before patterned or production wafers are polished, which extends polishing pad lifetime and results in cost reductions. The embedded dummy disks comprise unpatterned films that comprise similar materials of films and material layers of the patterned or production wafers, in some embodiments. Because the embedded dummy disks are embedded in the CMP tools, the embedded dummy disks advantageously do not require entry into the CMP tools using the load ports of the CMP tools. Throughout the various views and illustrative embodiments, like reference numerals are used to designate like elements.

Referring first to FIG. 1, a diagram is shown of a CMP tool 100 in accordance with some embodiments of the present disclosure that includes an embedded dummy disk 114. Components of the CMP tool 100 relevant to the present disclosure are illustrated: the CMP tool 100 may also include other components that are not shown. The CMP tool 100 may also include other stations than a polishing station, for example, such as a cleaning station, a drying station, or other types of stations.

The CMP tool 100 includes a housing 102 which provides a sealed, contained system for components of the CMP tool 100 in some embodiments, for example. A load port 126 is coupled to the housing 102 which allows for insertion of a wafer 112 or wafers into the CMP tool 100. The CMP tool 100 may also include a plurality of load ports 126 coupled to the housing 102, not shown. The wafer 112 comprises a production wafer or a patterned wafer in some embodiments. The wafer 112 may also comprise other types of wafers 112, such as a test wafer.

The CMP tool 100 includes a platen 104 that is adapted to support a polishing pad 106. The polishing pad 106 and platen 104 are rotated during a CMP process by a mechanism (not shown) coupled to the platen 104, for example. The platen 104 and the polishing pad 106 are larger than the wafer 112 in some embodiments. The polishing pad 106 is removable and is attached to the platen 104 by an adhesive film, adhesive, or glue in some embodiments. The polishing pad 106 may also be coupled to the platen 104 by other means. A heater or heaters, not shown, may be disposed beneath the platen 104 to increase the temperature of the platen 104 during a CMP process.

The CMP tool 100 includes a carrier 110a that is adapted to retain a wafer 112 during a CMP process, for example. The carrier 110a for the wafer 112 is also referred to herein as a first carrier 110a. The first carrier 110a is rotatable by a mechanism (not shown) attached thereto. The first carrier 110a may include a line, hose, or tube for a vacuum which may be used for picking up and retaining the wafer 112 while moving the wafer 112 to various stations of the CMP tool 100 and during the CMP process. The wafer 112 typically comprises a patterned layer of material disposed thereon that needs planarizing, smoothing, or a reduction in thickness, for example. The wafer 112 may be picked up by the first carrier 110a using the vacuum from the load port 126, and the first carrier 110a moves the wafer 112 to the polishing pad 106, and lowers and presses the wafer 112 against the polishing pad 106 for a CMP process. After the CMP process is complete, the wafer 112 is lifted again by the vacuum, and the wafer 112 is returned to the load port 126 or to another station in the CMP tool 100.

The CMP tool 100 includes a carrier 110b that is adapted to retain an embedded dummy disk 114. The carrier 110b is also referred to herein as a second carrier 110b. The second carrier 110b may comprise a similar type and/or size of carrier as the first carrier 110a, or the second carrier 110b may comprise a different type and/or size of carrier as the first carrier 110a. In some embodiments, the second carrier 110b is substantially the same size or less than the size of the first carrier 110a.

The embedded dummy disk 114 comprises a film 162 (not shown in FIG. 1; see FIG. 21) or material disposed thereon that is not patterned, in some embodiments. The embedded dummy disk 114 will be described further herein with reference to FIG. 21. The unpatterned film of the embedded dummy disk 114 may comprise similar materials of films and material layers of the wafers 112 that may comprise production, patterned, or test wafers, in some embodiments. The embedded dummy disk 114 may be affixed to the second carrier 110b using an adhesive or a mechanical connection, in some embodiments. The embedded dummy disk 114 may be coupled to the second carrier 110b using an adhesive film, a glue, or a mechanical attachment such as screws or bolts, for example. The embedded dummy disk 114 may also be coupled to the second carrier 110b using a vacuum. The embedded dummy disk 114 may also be attached to the second carrier 110b using other means.

The second carrier 110b and the embedded dummy disk 114 collectively comprise a device 101 comprising an embedded dummy polishing disk for the CMP tool 100 in some embodiments, for example. The embedded dummy disk 114 is adapted to be polished by the CMP tool 100 in preparation for a polishing process (i.e., a CMP process) for the wafer 112, in some embodiments.

The first carrier 110a and the second carrier 110b are coupled to a handler 116 by arms 118a and 118b, respectively. The handler 116 may comprise a robotic machine, automated machine, or a transfer robot that is adapted to mechanically operate positioning of various components of the CMP tool 100, such as the first carrier 110a and the second carrier 110b, during the CMP process, for example. The handler 116 may include a plurality of arms 118a, 118b, and 118c. The plurality of arms 118a, 118b, and 118c may comprise robotic arms, for example. The handler 116 may also include additional arms, not shown (see additional arms of the handler 116 shown in FIGS. 7 through 9). The first carrier 110a and the second carrier 110b include or are coupled to mechanisms (not shown) that are adapted to rotate the first carrier 110a and the second carrier 110b during a CMP process.

The CMP tool 100 includes a diamond disk 120 coupled to the handler 116 by an arm 118c. The diamond disk 120 includes embedded or encapsulated cut diamond particles on a substrate. The diamond disk 120 includes or is coupled to a mechanism (not shown) that is adapted to rotate the diamond disk 120. The diamond disk 120 is used to dress the polishing pad 106 surface, e.g., to remove polishing by-products. The diamond disk 120 is a diamond conditioning tool that also shapes the polishing pad 106 and affects the polishing pad 106 surface roughness and polishing pad 106 life in some embodiments, for example.

A slurry dispenser 124 that is adapted to dispense a slurry 122 onto the platen 104 during a CMP process is disposed proximate the platen 104. The slurry dispenser 124 is attached to a tank or reservoir 125 that holds a supply of the slurry 122. The slurry dispenser 124 may comprise a nozzle on the end of a pivotable arm, so that the slurry dispenser 124 may be moved towards or away from the platen 104.

The embedded dummy disk 114 may be used after part maintenance of the CMP tool 100, for example, after replacing parts such as the polishing pad 106 or other parts, or after servicing or cleaning the first carrier 110a, the second carrier 110b, the diamond disk 120, and other components of the CMP tool 100. The embedded dummy disk 114 may also be used after a wet idle cycle, for example. The second carrier 110b and the embedded dummy disk 114 are advantageously both embedded within the CMP tool 100 within the housing 102. Including or embedding the embedded dummy disk 114 within the CMP tool 100 avoids a need to load dummy disks from outside the CMP tool 100, which may increase pad life of the polishing pad 106, for example. The embedded dummy disk 114 does not have a retainer ring which may comprise a hard material or thermoplastic such as polyetheretherketone (PEEK) or polyphenylene sulfide (PPS), which would consume a thickness of the polishing pad 106 thickness, for example. Thus, advantageously, the embedded dummy disk 114 does not consume the polishing pad 106 and is not included in a wafer count for determining polishing pad 106 life in some embodiments, for example.

In a CMP or polishing process for a wafer 112, the polishing pad 106 is rotated, and the first carrier 110a is lowered until the wafer 112 contacts the polishing pad 106. The first carrier 110a is rotated while applying a downward force onto the rotating polishing pad 106. The diamond disk 120 is also placed against the polishing pad 106 and is rotated, and the slurry 122 is dispensed by the slurry dispenser 124 onto the polishing pad 106. The slurry 122 provides a chemical component for the CMP process, and a roughness of the surface of the polishing pad 106 provides a mechanical component for the CMP process. The arm 118a may repeatedly sweep or move the first carrier 110a back and forth over the polishing pad 106 surface in some embodiments to polish the wafer 112 surface, for example. Likewise, the diamond disk 120 may also be swept back and forth to clean and condition the surface of the polishing pad 106, before, during, and/or after the CMP process.

In some embodiments, a device 101 for a CMP tool 100 includes a carrier such as the second carrier 110b shown in FIG. 1. An embedded dummy disk 114 is coupled to the carrier. The embedded dummy disk 114 comprises a substrate 160 and a film 162 disposed over the substrate 160 (see FIG. 21, which will be described further herein). The carrier is coupleable to an arm 118b of the handler 116 of the CMP tool 100. The arm 118b shown in FIG. 1 may comprise an arm of the handler 116, for example. The carrier and the embedded dummy disk 114 are adapted to be embedded within a housing 102 of the CMP tool 100. The embedded dummy disk 114 is adapted to be polished by the CMP tool 100 in preparation for a polishing process for a wafer 112. Polishing the embedded dummy disk 114 prepares the slurry 122 and other conditions of the CMP parameters for a CMP process of the wafer 112.

In some embodiments, the second carrier 110b comprises a dedicated disk carrier for the embedded dummy disk 114. The second disk carrier 110b is not used to polish other wafers or objects within the CMP tool 100 in some embodiments, for example. Likewise, the arm 118b coupled to the second carrier 110b comprises a dedicated arm for the embedded dummy disk 114.

Figure 2:
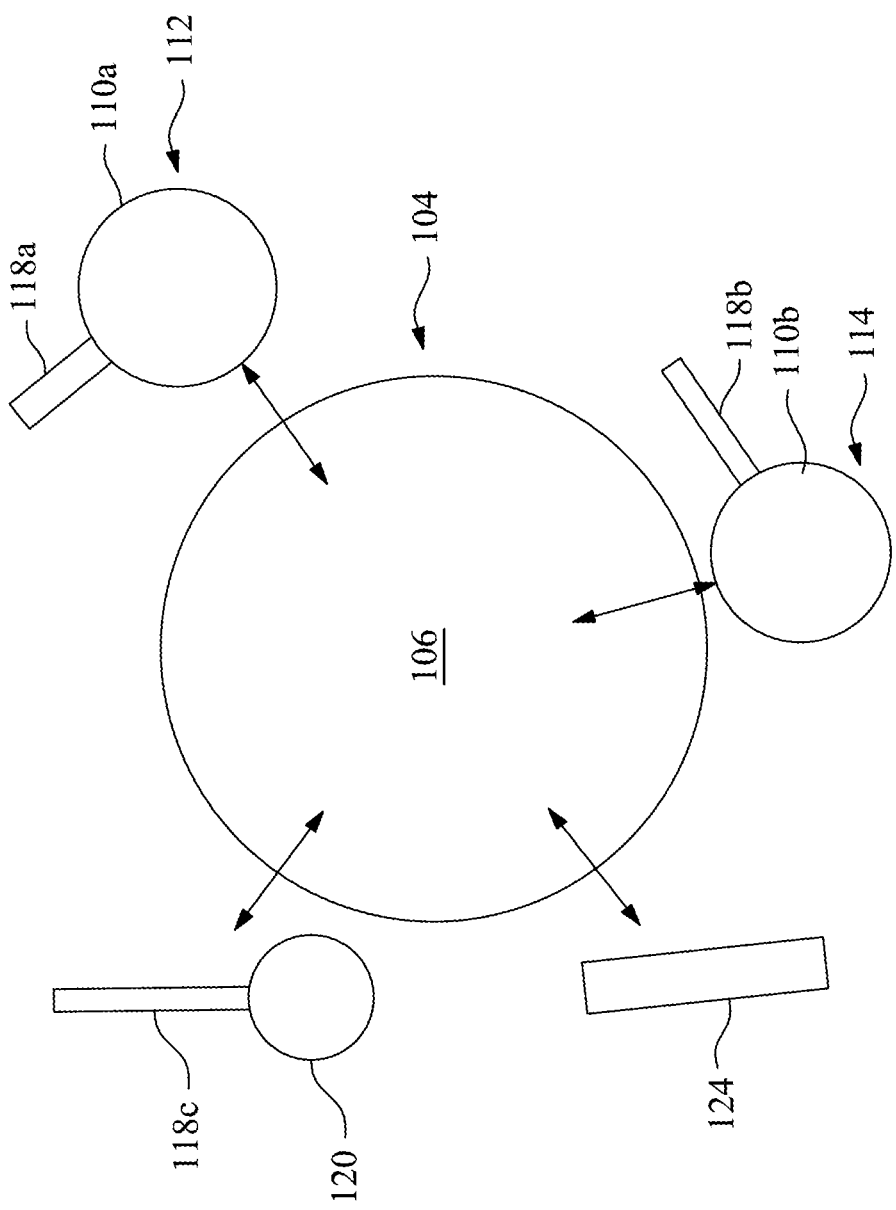
FIGS. 2 and 3 are top views of portions of the CMP tool shown in FIG. 1 in accordance with some embodiments.
Figure 3:
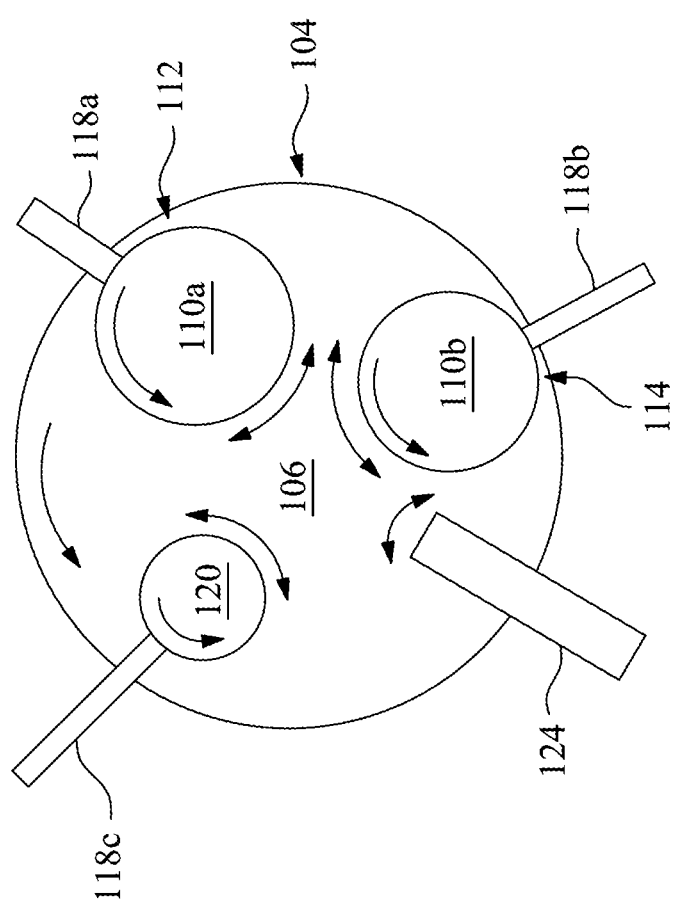

FIGS. 2 and 3 are top views of portions of the CMP tool 100 shown in FIG. 1 in accordance with some embodiments. The wafer 112 may be moved away from or towards the platen 104 using the arm 118a attached to the first carrier 110a. Likewise, the embedded dummy disk 114 may be moved away from or towards the platen 104 using the arm 118b attached to the second carrier 110b, and the diamond disk 120 may be moved away from or towards the platen 104 using the arm 118c attached to the diamond disk 120. Similarly, the slurry dispenser 124 may be moved away from or towards the platen 104. The first carrier 110a, the second carrier 110b, and the diamond disk 120 are adapted to move and sweep across the polishing pad 106 during their operation in a CMP process, for example. The handler 116 or a controller (not shown) may be adapted to move the arms 118a, 118b, 118c and/or the slurry dispenser 124, for example. FIG. 2 illustrates an "away from" position of the wafer 112, the embedded dummy disk 114, the diamond disk 120, and the slurry dispenser 124.

FIG. 3 illustrates a position of the wafer 112, the embedded dummy disk 114, the diamond disk 120, and the slurry dispenser 124 disposed over the platen 106, e.g., disposed over the polishing pad 106 over the platen 104. Some directional movements of the wafer 112, the embedded dummy disk 114, the diamond disk 120, the slurry dispenser 124, and the polishing pad 106 on the platen 104 are also illustrated in FIG. 3 by arrows.

Figure 4:
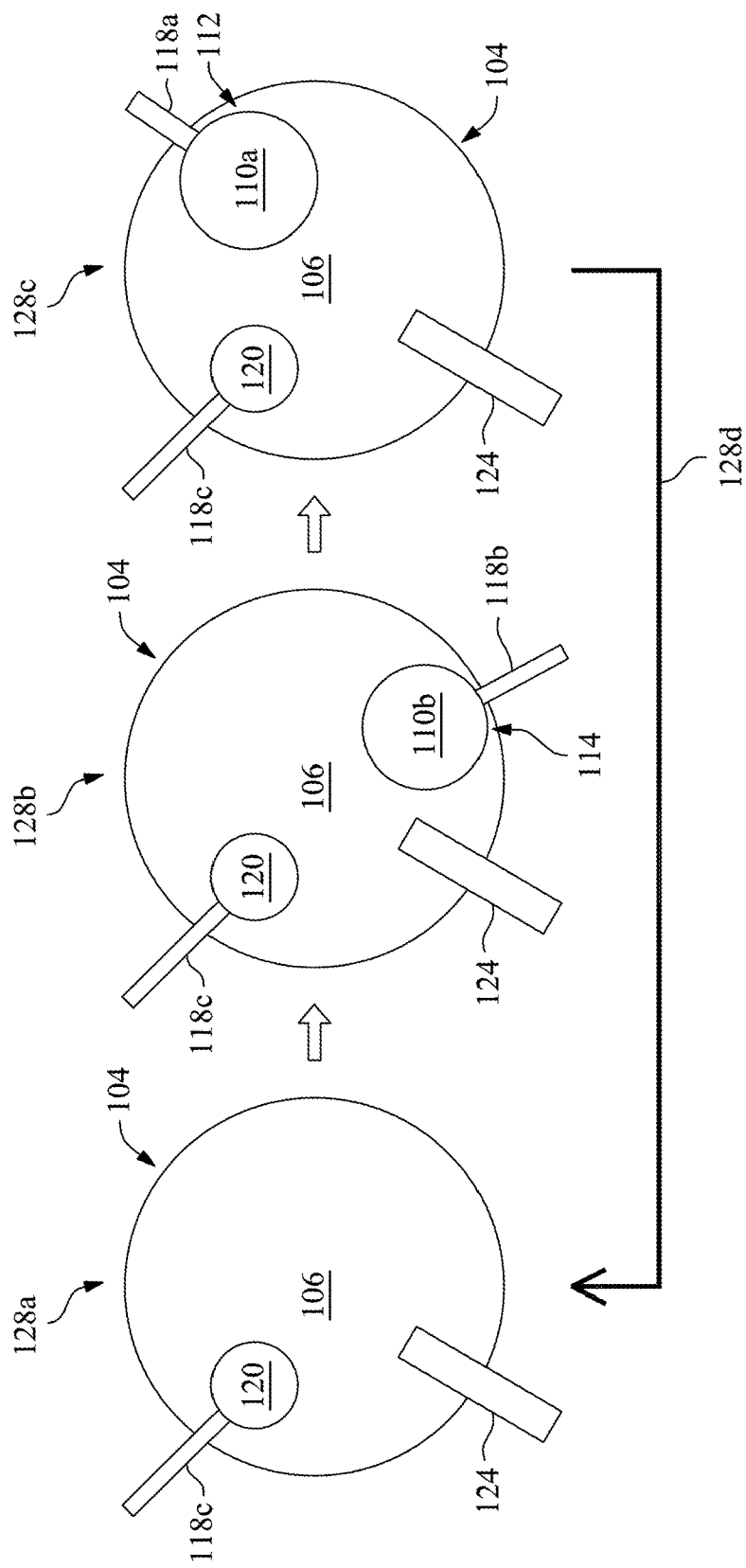
FIG. 4 illustrates top views of a portion of a CMP tool at various stages of a polishing process in accordance with some embodiments.

In some embodiments, the embedded dummy disk 114 is not placed on or pressed against the polishing pad 106 at the same time that the wafer 112 is placed on the polishing pad 106. For example, FIG. 4 illustrates top views of a portion of a CMP tool 100 at various stages of a polishing process in accordance with some embodiments. In some embodiments, the embedded dummy disk 114 may be placed on or pressed against the polishing pad 106 at the same time that the wafer 112 is placed on the polishing pad 106.

Stage 128a is a wet idle stage or cycle wherein the diamond disk 120 is in use cleaning the polishing pad 106, and the slurry dispenser 124 is dispensing a high pressure rinse of de-ionized water. The high pressure rinse may comprise about 5 to about 10 liters/minute of de-ionized water, for example. The high pressure rinse may also comprise other pressure levels or chemistries. The wet idle stage 128a may be implemented between CMP processes of wafers to maintain CMP tool 100 chamber wetting (i.e., to keep the chamber wet inside the housing 102) to prevent defect issues, for example. The wet idle stage 128a is performed before polishing the embedded dummy disk 114 in a slurry 122 in some embodiments. The wet idle stage 128a comprises a time duration of about 3 minutes to about 10 minutes in some embodiments. The wet idle stage 128a may also comprise other time durations.

Before or after a wafer 112 is placed in the CMP tool 100, stage 128b is implemented. Stage 128b is a polish process for the embedded dummy disk 114 in a slurry dispensed from the slurry dispenser 124. The polishing process of the embedded dummy disk 114 in stage 128b prepares the polishing pad 106 and slurry 122 (see FIG. 1) on the polishing pad 106 for polishing the wafer 112. The diamond disk 120 shown in FIG. 1 may or may not be activated or dress the polishing pad 106 during stage 128b, in some embodiments, for example. The stage 128b comprising the polish process for the embedded dummy disk 114 may comprise a time duration of about 5 seconds to about 200 seconds in some embodiments. Stage 128b may also comprise other time durations, such as about 200 seconds or greater.

When the wafer 112 is ready to be polished, the second carrier 110b including the embedded dummy disk 114 coupled thereto is moved away from the platen 104, and the first carrier 110a including the wafer 112 attached thereto is moved proximate the platen 104. Stage 128c is then implemented, which is a wafer 112 polish stage. In some embodiments, a time period between stage 128b and stage 128c is less than about 3 minutes. In some embodiments, the time period between stage 128b and stage 128c is from about 0 seconds to about 2 minutes, as another example. The time period between stage 128b and stage 128c may also comprise other time durations.

After stage 128c, the wet idle stage 128a is then repeated for a subsequent wafer 112 or batch of wafers 112, as shown at 128d.

FIGS. 5 through 9 show top views of portions of a CMP tools 100 that include various numbers of embedded dummy disks 114 and second carriers 110b for the embedded dummy disks 114 in accordance with some embodiments. In FIG. 5, the CMP tool 100 includes one second carrier 110b, one arm 118b for the second carrier 110b coupled to the second carrier 110b, and one embedded dummy disk 114 coupled to the second carrier 110b. The embedded dummy disk 114 is disposed beneath the second carrier 110b in the view shown, for example. The embedded dummy disk 114 is coupled to the handler 116 (see FIG. 1) by the second carrier 110b and the arm 118b.

In some embodiments, a plurality of the second carriers 110b is coupled to the handler 116, wherein each of the plurality of second carriers 110b comprises an embedded dummy disk 114 coupled thereto. For example, in FIG. 6, the CMP tool 100 includes two second carriers 110b, two arms 118b for the two second carriers 110b, and two embedded dummy disks 114 coupled to the second carriers 110b. Each arm 118b is coupled to one of the second carriers 110b, and each embedded dummy disk 114 is coupled to one of the second carriers 110b. Each arm 118b is coupled to the handler 116 shown in FIG. 1.

Figure 8:
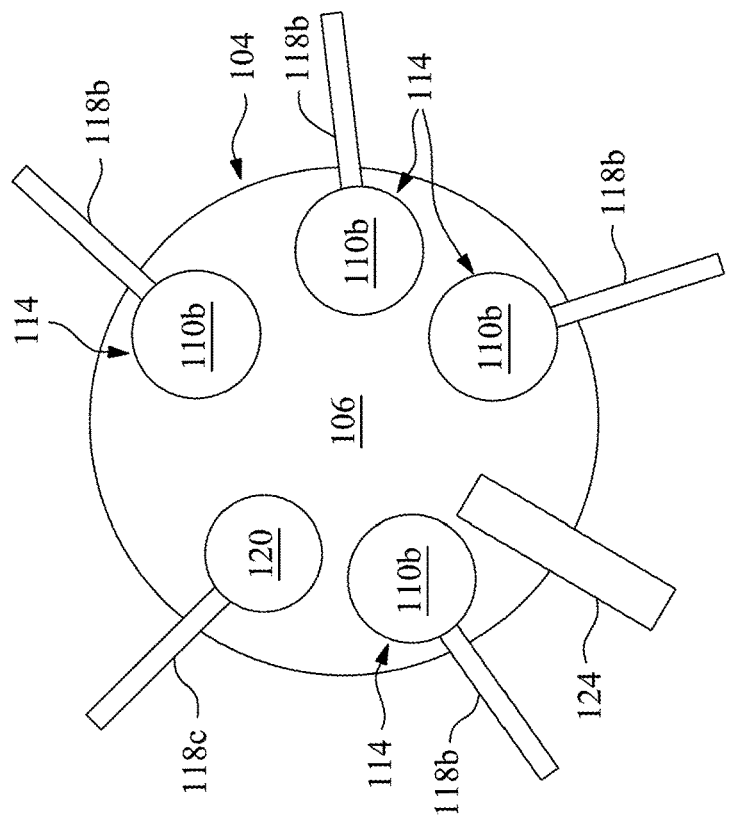
Figure 7:
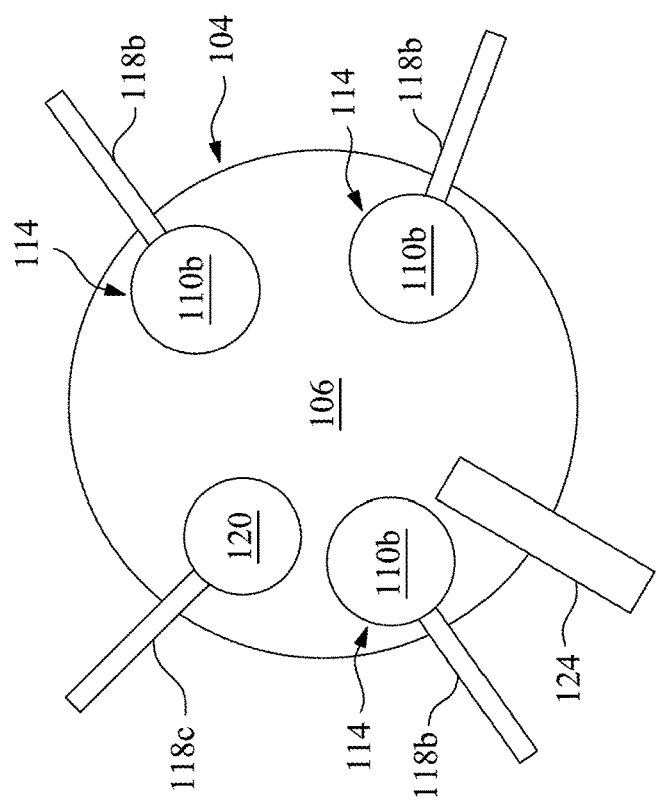
Figure 9:
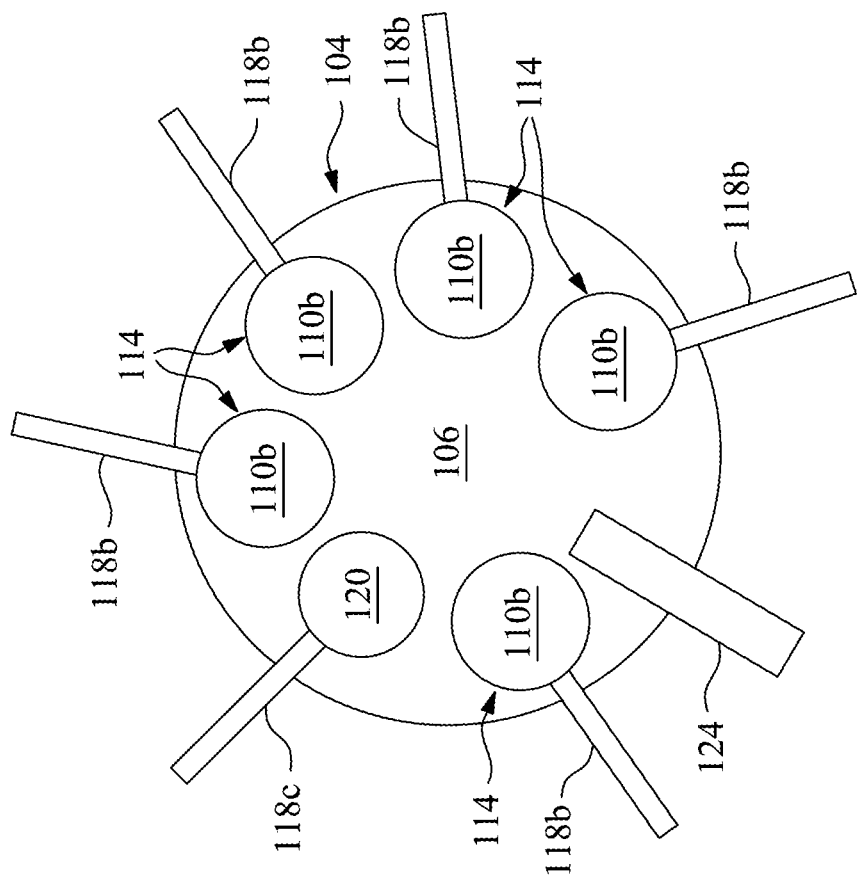
Figure 12:
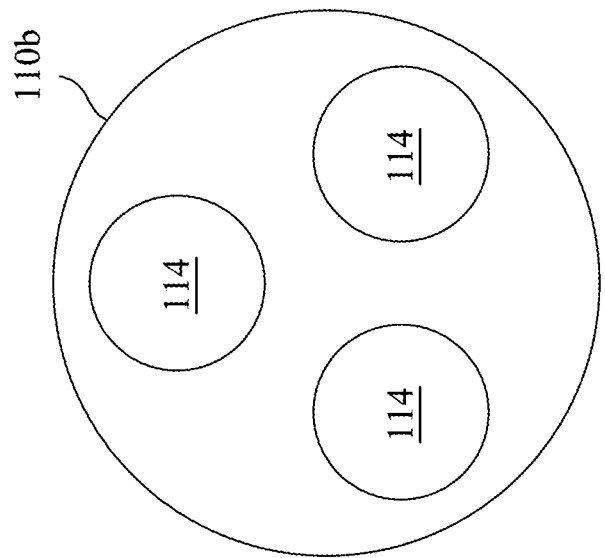
Figure 11:
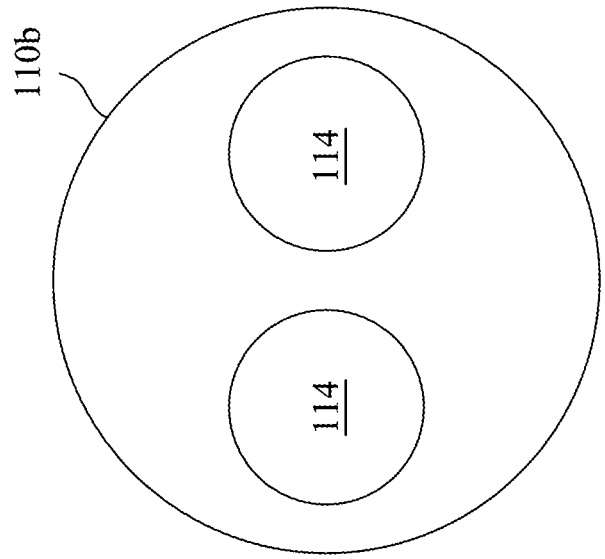
Figure 14:
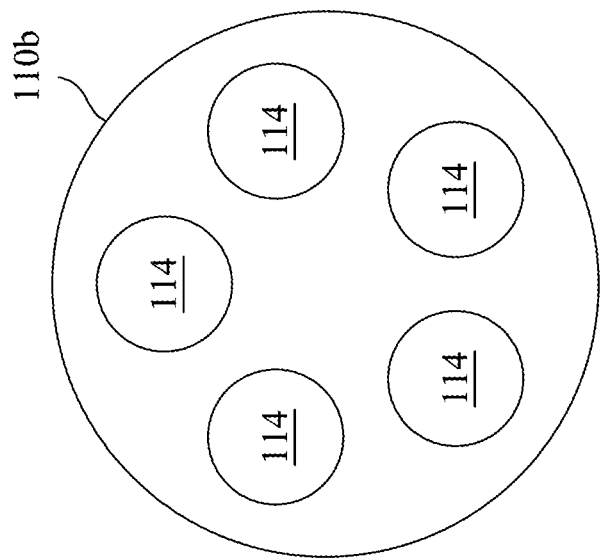

Likewise, in FIG. 7, the CMP tool 100 includes three second carriers 110b, three arms 118b for the three second carriers 110b, and three embedded dummy disks 114 coupled to the three second carriers 110b; in FIG. 8, the CMP tool 100 includes four second carriers 110b, four arms 118b for the four second carriers 110b, and four embedded dummy disks 114 coupled to the four second carriers 110b; and in FIG. 9, the CMP tool 100 includes five second carriers 110b, five arms 118b for the five second carriers 110b, and five embedded dummy disks 114 coupled to the five second carriers 110b. The CMP tool 100 may also comprise greater than five second carriers 110b for embedded dummy disks 114, each operatable by a separate arm 118b, such as about up to ten or so, in accordance with some embodiments of the present disclosure.

Figure 10:
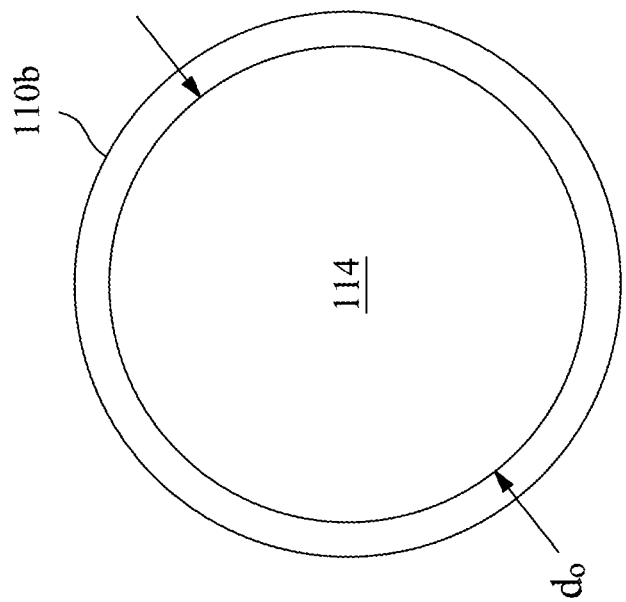
FIGS. 10 through 14 illustrate bottom views of carriers that include various numbers of embedded dummy disks in accordance with some embodiments.

FIGS. 10 through 14 illustrate bottom views of second carriers 110b that include various numbers of embedded dummy disks 114 in accordance with some embodiments. FIG. 10 shows some embodiments wherein one embedded dummy disk 114 is coupled to the bottom of the second disk carrier 110b. The embedded dummy disk 114 may comprise substantially the same size as the second carrier 110b bottom surface in some embodiments, for example. The embedded dummy disk 114 may comprise a width or diameter comprising dimension $d_0$, wherein dimension $d_0$ comprises about one inch to about twelve inches in some embodiments, for example. The embedded dummy disk 114 may also comprise other dimensions.

Figure 13:
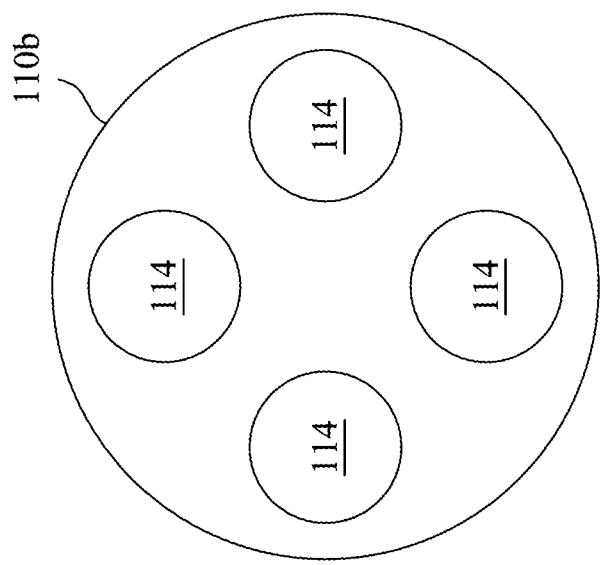

In other embodiments, a plurality of the embedded dummy disks 114 are coupled to the second carrier 110b. For example, in FIG. 11, two embedded dummy disks 114 are coupled to the bottom of the second carrier 110b, and in FIG. 12, three embedded dummy disks 114 are coupled to the bottom of the second carrier 110b. In FIG. 13, four embedded dummy disks 114 are coupled to the bottom of the second carrier 110b, and in FIG. 14, five embedded dummy disks 114 are coupled to the bottom of the second carrier 110b. The patterns of the plurality of embedded dummy disks 114 are examples; the plurality of embedded dummy disks 114 may also be arranged in other patterns and shapes. Six or more embedded dummy disks 114 may also be coupled to the bottom of the second carrier 110b in some embodiments, for example. In some embodiments, about one to about 100 embedded dummy disks 114 may be coupled to the bottom of the second carrier 110b, as another example.

Note that some of the embodiments shown in FIGS. 5 through 9 and FIGS. 10 through 14 may be combined. For example, two or more second carriers 110b may be included in a CMP tool 100, and each of the second carriers 110b may have one embedded dummy disk 114 or a plurality of embedded dummy disks 114 coupled thereto. As another example, the second carrier 110b may comprise a plurality of embedded dummy disks 114 disposed thereon, and a plurality of the second carriers 110b may be coupled to the handler 116 shown in FIG. 1.

Figure 15:
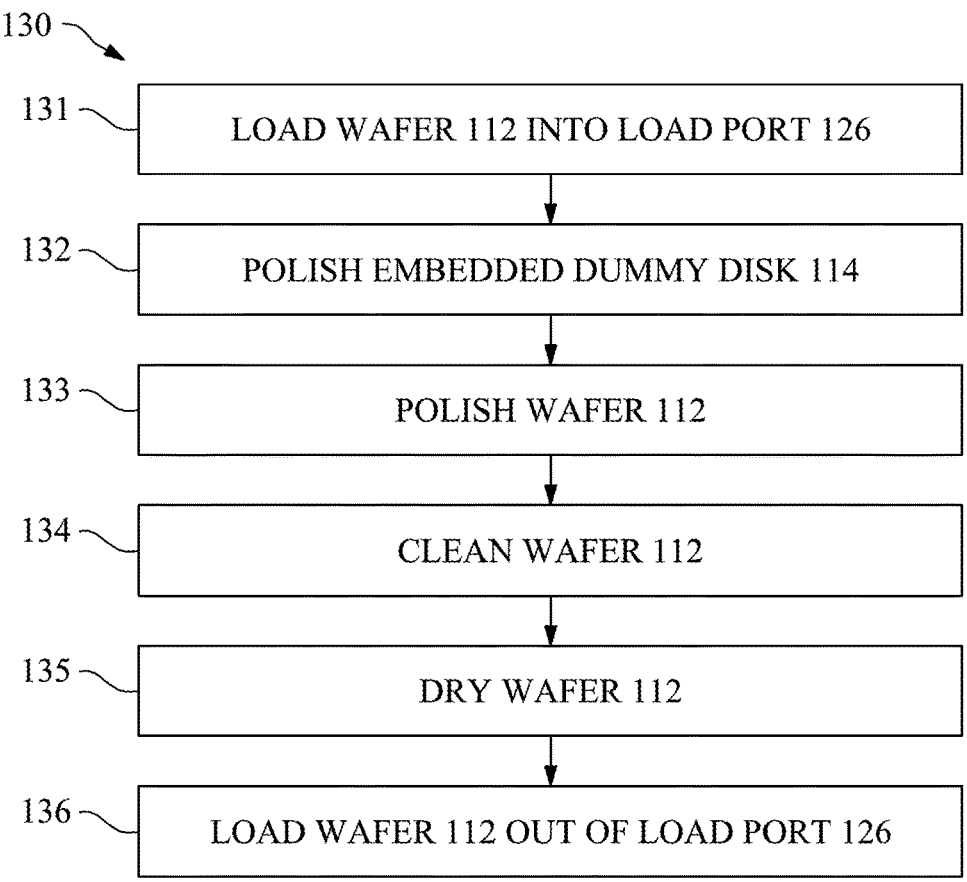
FIG. 15 is a flow chart that illustrates a CMP method using an embedded dummy disk in accordance with some embodiments.
Figure 16:
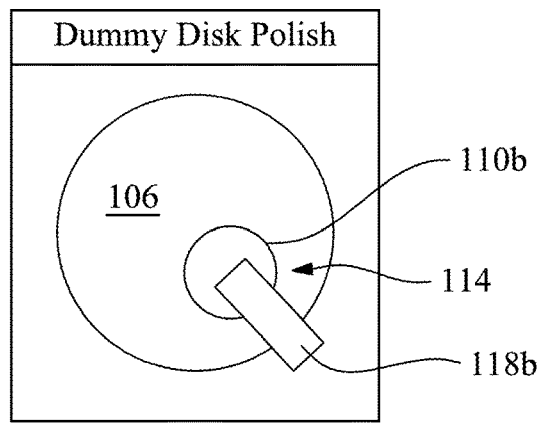
FIGS. 16 through 19 are diagrams that illustrate various stages of a CMP process in accordance with some embodiments.
Figure 17:
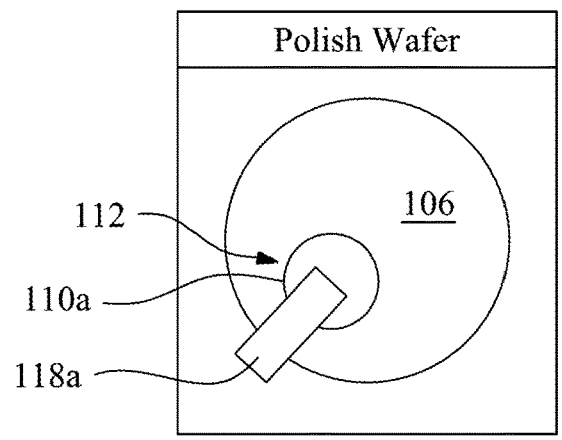
Figure 18:
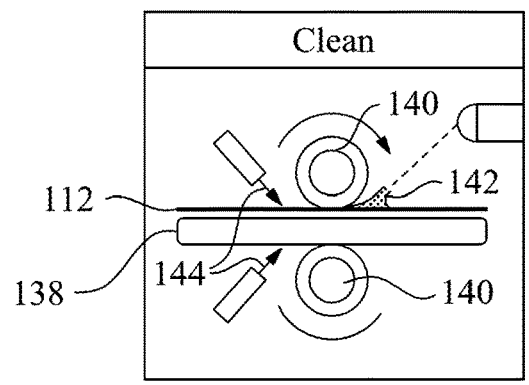
Figure 19:
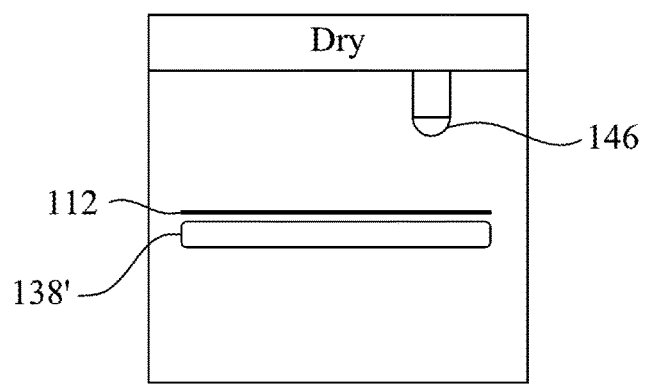

FIG. 15 is a flow chart 130 that illustrates a CMP method using an embedded dummy disk 114 in accordance with some embodiments. For steps 132 through 135, refer also to FIGS. 16 through 19, which will be described further herein. In step 131, a wafer 112 is loaded into the load port 126 of a CMP tool 100 (see also FIG. 1). In step 132, an embedded dummy disk 114 that is embedded in the CMP tool 100 is polished (FIG. 16). In step 133, the wafer 112 that was loaded into the load port 126 in step 131 is polished (FIG. 17). In step 134, the wafer is cleaned (FIG. 18). In step 135, the wafer is dried (FIG. 19). In step 136, the wafer 112 is loaded out of the load port 126.

FIGS. 16 through 19 are diagrams that illustrate various stages of a CMP process in accordance with some embodiments. FIG. 16 is a top view of a polishing pad 106 that illustrates an embedded dummy disk 114 polishing process. The arm 118b coupled to the second carrier 110b moves the second carrier 110b and embedded dummy disk 114 (or embedded dummy disks 114, in embodiments wherein a plurality of the embedded dummy disks 114 are coupled to the second carrier 110b) over the polishing pad 106 on the platen 104. The embedded dummy disk 114 is lowered and placed against the polishing pad 106, polishing the embedded dummy disk 114 and preparing the surface of the polishing pad 106 and the slurry 122 for a polishing process for a wafer 112.

In FIG. 17, a top view of a polishing pad 106 is shown that illustrates a wafer 112 polishing process. When the wafer 112 is ready to be polished, the arm 118b coupled to the second carrier 110b shown in FIG. 16 moves the second carrier 110b and embedded dummy disk 114 away from the polishing pad 106 on the platen 104. The arm 118a coupled to the first carrier 110a moves the first carrier 110a and the wafer 112 over the polishing pad 106 on the platen 104. The wafer 112 is lowered and placed against the polishing pad 106, polishing the wafer 112. The polishing process is continued for a predetermined time, depending on a desired outcome such as a thickness or planarization of a material layer disposed on the wafer 112, for example. The polishing process may be continued for a few seconds to several minutes, for example. The polishing process may also be continued for longer or shorter periods of time. The arm 118a coupled to the first carrier 110a then moves the first carrier 110a and the wafer 112 away from the polishing pad 106 on the platen 104.

The wafer 112 is then removed from the CMP tool 100, in some embodiments. In some embodiments, the CMP tool 100 may include cleaning and drying stations, and the wafer 112 may not yet be removed from the CMP tool 100.

In FIG. 18, the wafer 112 is placed on a support 138, e.g., in a tool adapted to clean wafers such as a wafer cleaner, or in a cleaning station of the CMP tool 100, not shown. The wafer 112 is cleaned using brushes 140, de-ionized water 142, and a cleaning solution 144 in some embodiments. The cleaning solution 144 may comprise SC-1, $NH_4OH$, HF, citric acid, or other chemicals, for example, in some embodiments. The wafer 112 may also be removed from the CMP tool 100 and cleaned in a vat or bath in some embodiments, not shown. The wafer 112 may also be cleaned using other methods, devices, and materials. Cleaning the wafer 112 comprises substantially removing the slurry 122 from the wafer 112 in some embodiments, for example.

In FIG. 19, the cleaned wafer 112 is placed on a support 138', e.g., in a tool adapted to dry wafers, such as a wafer dryer, or in a drying station of the CMP tool 100, not shown. A device 146 adapted to apply a drying agent such as nitrogen, isopropyl alcohol, isopropanol, or other chemicals is used to apply the drying agent to the wafer 112, to dry the surface of the wafer 112.

The processing steps for the CMP processes described herein are examples: the processing steps for the CMP processes may also comprise other steps and order of steps.

Figure 20:
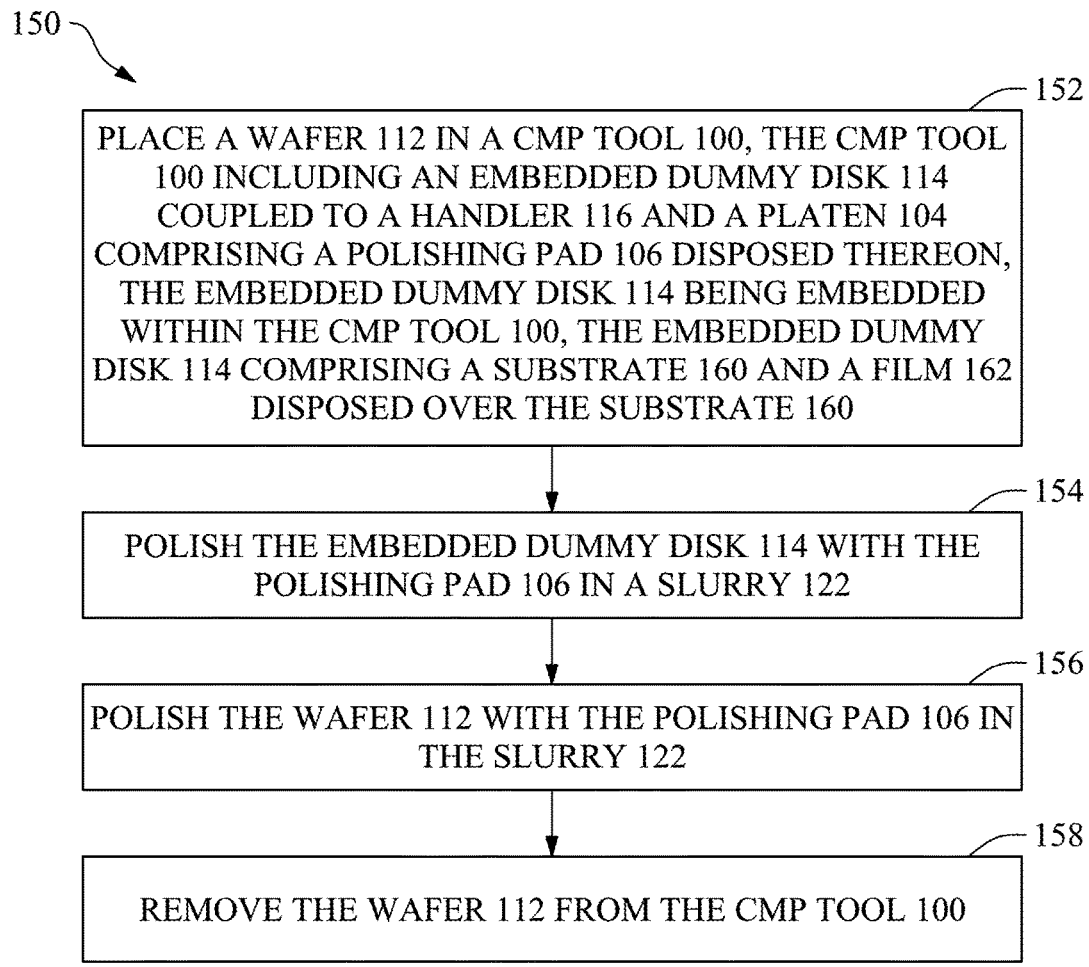
FIG. 20 is a flow chart that illustrates a CMP method using an embedded dummy disk in accordance with some embodiments.

FIG. 20 is a flow chart 150 that illustrates a CMP method using an embedded dummy disk 114 within a CMP tool 100 in accordance with some embodiments. In step 152, a wafer 112 is placed in a CMP tool 100, the CMP tool 100 including an embedded dummy disk 114 coupled to a handler 116 and a platen 104 comprising a polishing pad 106 disposed thereon. The embedded dummy disk 114 is embedded within the CMP tool 100 and includes a substrate 160 and a film 162 disposed over the substrate 160. In step 154, the embedded dummy disk 114 is polished with the polishing pad 106 in a slurry 122. In step 156, the wafer 112 is polished with the polishing pad 106 in the slurry 122. In step 158, the wafer 112 is removed from the CMP tool 100.

Figure 21:
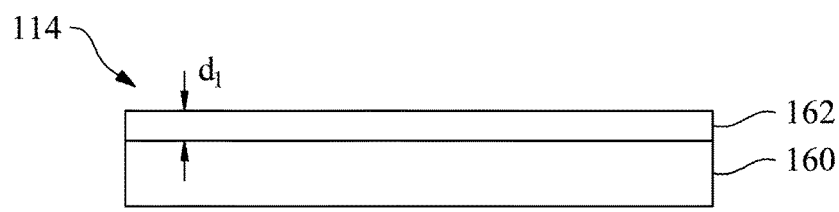
FIG. 21 shows a cross-sectional view of an embedded dummy disk in accordance with some embodiments of the present disclosure.

FIG. 21 shows a cross-sectional view of an embedded dummy disk 114 in accordance with some embodiments of the present disclosure. The embedded dummy disk 114 comprises a substrate 160 and a film 162 disposed over the substrate 160 in some embodiments. The substrate 160 comprises a semiconductive material, a metal, a polymer, or a combination thereof in some embodiments. The substrate 160 may comprise silicon, stainless steel, or a polymer such as polycarbonate (PC), as examples. The substrate 160 may comprise a thickness of about 0.3 cm to about 10 cm in some embodiments, for example. The substrate 160 may also comprise other materials and dimensions.

The film 162 comprises an oxide material, a nitride material, a metal, or a combination thereof in some embodiments. The film 162 may comprise a single material layer or a multi-stack material layer, for example. The film 162 may comprise $SiO_2$ and derivatives thereof, such as undoped silicate glass (USG), phosphosilicate glass (PSG), borophosphosilicate glass (BPSG), and the like, as examples. The film 162 may comprise SiN and derivatives thereof, such as SiCN, SiON, SiOCN, and the like, as examples. The film 162 may comprise a metal film such as Cu, Al, W, Co, Ta, Ti, Ni, and the like, metal oxides thereof, or metal nitrides thereof, as other examples. The film 162 may comprise one or more layers of these materials and/or other materials, for example. For example, the film 162 may comprise $SiO_2$; USG; PSG; BPSG; SiN; SiCN; SiON; SiOCN; Cu, Al, W, Co, Ta, Ti, Ni, metal oxides thereof, and/or metal nitrides thereof; and/or combinations or multiple layers thereof in some embodiments. The film 162 may comprise a formation method suitable for the material used. For example, the film 162 may be deposited, spun-on, laminated, or plated onto or over the substrate 160. The film 162 may comprise a thickness comprising dimension $d_1$, wherein dimension $d_1$ comprises about 1 µm to about 2 mm in some embodiments for example. Dimension $d_1$ of the film 162 comprises a thickness sufficient to adequately prepare the polishing pad 106 and/or slurry 122 for a subsequent polishing process for a wafer 112 in some embodiments, for example. Dimension $d_1$ also comprises a thickness such that the embedded dummy disk 114 will not need replacing often or ever, in some embodiments. The film 162 may also comprise other materials, dimensions, and formation methods. In some embodiments, the film 162 of the embedded dummy disk 114 is unpatterned. In other embodiments, the film 162 may be patterned.

The device 101 including the second carrier 110b and the embedded dummy disk 114 comprises a dummy disk that has a size (e.g., a width or diameter) that is less than or about the same as the size of the first carrier 110a and the wafer 112 to be polished in some embodiments. For example, in embodiments wherein the wafer 112 is about 12 inches wide, the dummy disk may comprise about 1 inch to 12 inches wide, as an example. The dummy disk may also comprise other dimensions and relative dimensions.

Some embodiments of the present disclosure include devices for CMP tools that include the embedded dummy disk or disks described herein. Other embodiments include CMP tools that include the embedded dummy disk or disks. Other embodiments include CMP methods that utilize the embedded dummy disk or disks and CMP methods performed within CMP tools that include the embedded dummy disk or disks described herein.

Some advantages of some embodiments of the present disclosure may include providing CMP devices, tools, and methods that provide a cost savings by not requiring dummy wafers to be loaded from a source external to the CMP tool into load ports of the CMP tools, which is costly, occupies load ports, and decreases polishing pad life. Thus, some embodiments of the present disclosure may provide a cost and time savings and may extend polishing pad life. Polishing pad life efficiency may be improved by including the embedded dummy disks described herein into CMP tools, for example. The embedded dummy disks may also assist in recovering CMP tool chamber surroundings after parts maintenance of the CMP tool or after wet idle cycles, for example. The embedded dummy disks do not consume polishing pad thickness or contribute to or count as polishing pad life in some embodiments as are wafers entered in through the load port and are polished are counted in the wafer count number, in some embodiments. The embedded dummy disks assist in preparing the slurry and other environmental parameters within a CMP device for polishing processes of wafers, for example. Furthermore, the devices, tools, and methods described herein are easily implementable into existing CMP process flows and tools.

In some embodiments, a device for a CMP tool includes a carrier and an embedded dummy disk coupled to the carrier. The embedded dummy disk comprises a substrate and a film disposed over the substrate. The carrier is coupleable to an arm of a handler of the CMP tool. The carrier and the embedded dummy disk are adapted to be embedded within a housing of the CMP tool. The embedded dummy disk is adapted to be polished by the CMP tool in preparation for a polishing process for a wafer.

In some embodiments, a CMP tool includes a housing, a platen disposed within the housing, and a polishing pad disposed on the platen. A slurry dispensing device is disposed within the housing proximate the platen, and a handler is disposed within the housing proximate the platen. A first carrier is coupled to the handler by a first arm, the first carrier being adapted to retain a wafer. A second carrier is coupled to the handler by a second arm, the second carrier having an embedded dummy disk coupled thereto. The embedded dummy disk has a substrate and a film disposed over the substrate. The second carrier and the embedded dummy disk are embedded within the CMP tool within the housing.

In some embodiments, a method of chemically-mechanically polishing a wafer comprises placing a wafer in a CMP tool, the CMP tool including an embedded dummy disk coupled to a handler and a platen having a polishing pad disposed thereon. The embedded dummy disk is embedded within the CMP tool. The embedded dummy disk has a substrate and a film disposed over the substrate. The method includes polishing the embedded dummy disk with the polishing pad in a slurry, polishing the wafer with the polishing pad in the slurry, and removing the wafer from the CMP tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device for a chemical-mechanical polishing (CMP) tool, the device comprising:
   a first carrier component configured to position at least one production wafer with regard to a polishing pad;
   a second carrier component, separate from the first carrier component and configured to position at least one embedded dummy disk with regard to the polishing pad;
   a pad conditioner, configured to position a pad conditioning disk over the polishing pad;
   wherein the at least one embedded dummy disk comprises a substrate and a film disposed over the substrate, wherein the second carrier component and the at least one embedded dummy disk are embedded within a housing of the CMP tool, and wherein the CMP tool is configured to polish the at least one embedded dummy disk in preparation for a polishing process for a wafer; and
   a handler connected to the first carrier component, the second carrier component, and the pad conditioner, the handler configured to handle the first carrier component to position the at least one production wafer against the polishing pad independently of the second carrier component and configured to handle the second carrier component to position the at least one embedded dummy disk against the polishing pad independently of the first carrier component.

2. The device according to claim 1, further comprising a plurality of the embedded dummy disks coupled to a carrier of the second carrier component.

3. The device according to claim 1, wherein the film of the embedded dummy disk comprises a thickness of about 1 µm to about 2 mm.

4. The device according to claim 1, wherein the film of the embedded dummy disk is unpatterned.

5. The device according to claim 1, wherein the film of the embedded dummy disk comprises a material selected from the group consisting essentially of an oxide material, a nitride material, a metal, and combinations thereof.

6. The device according to claim 1, wherein the film of the embedded dummy disk comprises a material selected from the group consisting essentially of $SiO_2$; undoped silicate glass (USG); phosphosilicate glass (PSG); borophosphosilicate glass (BPSG); SiN; SiCN; SiON; SiOCN; Cu, Al, W, Co, Ta, Ti, Ni, metal oxides thereof, or metal nitrides thereof; and combinations thereof.

7. The device according to claim 1, wherein the substrate of the embedded dummy disk comprises a material selected from the group consisting essentially of a semiconductive material, a metal, a polymer, and combinations thereof.

8. A chemical-mechanical polishing (CMP) tool comprising:
   a housing;
   a platen disposed within the housing;
   a polishing pad disposed on the platen;
   a slurry dispensing device disposed within the housing proximate the platen;
   a handler disposed within the housing proximate the platen;
   a pad conditioner coupled to the handler by a pad conditioning arm, the pad conditioner being disposed over the polishing pad;
   a first carrier coupled to the handler by a first arm, the first carrier being positioned to retain a wafer; and
   a second carrier coupled to the handler by a second arm, the second carrier comprising an embedded dummy disk coupled thereto, wherein the embedded dummy disk comprises a substrate and a film disposed over the substrate, and wherein the second carrier and the embedded dummy disk are embedded within the CMP tool within the housing, wherein the first carrier and the second carrier are respectively positioned independently of one another relative to the polishing pad by operation of the first arm and the second arm, respectively.

9. The CMP tool according to claim 8, further comprising a plurality of the second carriers coupled to the handler, wherein each of the plurality of the second carriers comprises an embedded dummy disk coupled thereto.

10. The CMP tool according to claim 8, wherein the second carrier comprises a plurality of the embedded dummy disks disposed thereon.

11. The CMP tool according to claim 10, further comprising a plurality of the second carriers coupled to the handler.

12. The CMP tool according to claim 8, wherein the second carrier comprises a dedicated disk carrier for the embedded dummy disk.

13. The CMP tool according to claim 8, wherein the wafer comprises a production wafer, a patterned wafer, or a test wafer.

14. A chemical-mechanical polishing (CMP) tool comprising:
   a load port coupled to a housing, and being configured to insert a wafer into the housing;
   a rotatable platen disposed within the housing, the rotatable platen configured to support a polishing pad thereon;
   at least one embedded dummy disk disposed within the housing;
   a pad conditioner disposed over the polishing pad;
   a handler disposed within the housing, the handler being coupled to a plurality of arms, wherein:
      a first arm of the plurality of arms couples a first carrier to the handler, wherein the first carrier is configured to retain the wafer for processing;
      a second arm of the plurality of arms couples a second carrier to the handler, independently of the first carrier, wherein the second carrier is configured to retain at least one dummy disk within the housing, the at least one dummy disk comprising:
         a substrate; and
         a film on the substrate, the film having a thickness sufficient to reduce or eliminate a need to replace the dummy disk; and
      a third arm of the plurality of arms couples the pad conditioner to the handler.

15. The CMP tool according to claim 14, wherein the polishing pad is configured to be removable from the rotatable platen.

16. The CMP tool according to claim 14, wherein the film on the substrate is unpatterned.

17. The CMP tool according to claim 14, wherein the second carrier is configured to retain ten or fewer dummy disks.

18. The CMP tool according to claim 14, wherein the wafer has a first diameter, the dummy disk has a second diameter, and the second diameter is less than or equal to the first diameter.

19. The CMP tool according to claim 14, wherein the thickness of the film is about 1 μm to about 2 mm.

20. The CMP tool according to claim 14, wherein a third arm of the plurality of arms couples a diamond disk to the handler.

* * * * *